(12) United States Patent
Schulze et al.

(10) Patent No.: US 7,696,605 B2
(45) Date of Patent: Apr. 13, 2010

(54) SEMICONDUCTOR COMPONENT COMPRISING A TEMPORARY FIELD STOPPING AREA, AND METHOD FOR THE PRODUCTION THEREOF

(75) Inventors: Hans-Joachim Schulze, Ottobrunn (DE); Josef Lutz, Chemnitz (DE)

(73) Assignee: Infineon Technologies AG, Munich (DE)

( * ) Notice: Subject to any disclaimer, the term of this patent is extended or adjusted under 35 U.S.C. 154(b) by 586 days.

(21) Appl. No.: 10/587,413

(22) PCT Filed: Jan. 24, 2005

(86) PCT No.: PCT/DE2005/000093

§ 371 (c)(1),
(2), (4) Date: Jun. 7, 2007

(87) PCT Pub. No.: WO2005/071757

PCT Pub. Date: Aug. 4, 2005

(65) Prior Publication Data

US 2007/0278514 A1 Dec. 6, 2007

(30) Foreign Application Priority Data

Jan. 27, 2004 (DE) ............ 10 2004 004 045

(51) Int. Cl.
*H01L 29/06* (2006.01)
(52) U.S. Cl. ............ 257/608; 257/607; 257/610; 257/612; 257/494; 257/E29.008
(58) Field of Classification Search ............ 257/607, 257/608, 610, 612, 494, E29.008
See application file for complete search history.

(56) References Cited

U.S. PATENT DOCUMENTS

| 4,752,818 | A | 6/1988 | Kushida et al. |
| 6,198,126 | B1* | 3/2001 | Mori et al. .......... 257/328 |
| 6,281,521 | B1* | 8/2001 | Singh .......... 257/77 |
| 6,369,424 | B1* | 4/2002 | Nakamura et al. .......... 257/339 |
| 6,707,131 | B2* | 3/2004 | Kitamura et al. .......... 257/610 |

FOREIGN PATENT DOCUMENTS

| DE | 19709652 A1 | 9/1998 | |
| DE | 101 00 802 C1 | 8/2002 | |
| EP | 0797257 | * 9/1997 | .......... 29/744 |
| EP | 0797257 A2 | 9/1997 | |
| EP | 1014453 A1 | 6/2000 | |

OTHER PUBLICATIONS

Siemieniec, Ralf, Josef Lutz and Reinhard Herzer. "Analysis of Dynamic Impatt Oscillation caused by Radiation Induced Deep Centers," ISPSD2003, Cambridge, 2003 (4 pages).

Niedernostheide, F.-J. et al. "13-kV Rectifiers: Studies on Diodes and Asymmetric Thyristors." *15th International Symposium on Power Semiconductor Devices & ICs*, Cambridge, Apr. 14-17, 2003 (4 pages).

* cited by examiner

*Primary Examiner*—Victor A Mandala
(74) *Attorney, Agent, or Firm*—Maginot, Moore & Beck

(57) ABSTRACT

The invention relates to a semiconductor component comprising a buried temporarily n-doped area (9), which is effective only in the event of turn-off from the conducting to the blocking state of the semiconductor component and prevents chopping of the tail current in order thus to improve the turn-off softness. Said temporarily effective area is created by implantation of K centers (10).

31 Claims, 6 Drawing Sheets

300ns

SEMICONDUCTOR COMPONENT COMPRISING A TEMPORARY FIELD STOPPING AREA, AND METHOD FOR THE PRODUCTION THEREOF

FIELD OF THE INVENTION

The present invention relates to a semiconductor component comprising a semiconductor body and at least two electrodes between which are situated in the semiconductor body at least one pn junction and a voltage taking-up region of the first conduction type, in which a space charge zone propagates if a voltage that reverse-biases the pn junction is applied to the electrodes. A zone of the first conduction type that is doped more highly than the voltage taking-up region may be provided between said voltage taking-up region and the electrode for said region. Moreover, the present invention relates to a method for the production of such a semiconductor component.

BACKGROUND

When a semiconductor component is turned off from its conducting state to its blocking state, as is known firstly a space charge zone forms proceeding from the reverse-biased pn junction, the voltage present at the semiconductor component being taken up in said space charge zone. If the semiconductor component is a diode, by way of example, then the space charge zone propagates proceeding from the pn junction of the diode in the direction of the cathode. In the "back part" of the diode, that is to say in the area before the cathode, part of the originally stored charge is then initially still present, but is reduced with increasing propagation of the space charge zone in the subsequent period. During this subsequent period during which the space charge zone propagates further, a so-called "tail current" flows, which is chopped only when the space charge zone arrives at the highly doped zone upstream of the cathode, that is to say at an $nn^+$ junction. Once the space charge zone abuts on said $nn^+$ junction this leads to chopping of the tail current. This sudden current chopping results in excessive voltage increases on account of the inductance and oscillations present in the electric circuit.

One example of this is shown in FIG. 6 for a 3.3 kV diode. At an instant of approximately t=3E-6 s after the turn-off of the diode, the tail current $i_T$ is chopped, which results in oscillations of the current i (A) still flowing overall between anode and cathode. Owing to the high di/dt gradient, this chopping of the tail current also generates voltage spikes, which are extremely undesirable since they may lead to the destruction of the component. It is necessary, therefore, as far as possible to avoid current chopping on account of the space charge zone abutting on $nn^+$ junctions in the event of the turn-off of a semiconductor component.

The above facts and measures undertaken previously with regard to these facts will be explained below with reference to FIGS. 7a and 7b, in which the doping profile for acceptors $N_A$ and for donors $N_D$ is plotted using solid lines and the profile of the electric field E that results from said doping profile is plotted using dashed lines as a function of the depth w of the semiconductor component. For the electric field E, a distinction is made here between a static field E(stat) and a dynamic case E(dyn) occurring particularly when the polarity is turned off. The width or depth of the weakly doped base zone, which essentially takes up the voltage, is indicated by $W_B$. The highest field strength, achieved in the static case, is $E_c$.

FIG. 7A reveals the p-doping of the anode zone, the $n^-$-type doping of the voltage taking-up region and the $n^+$-type doping of the highly conducting zone before the cathode. The curve E(dyn) indicates the situation in which the space charge zone abuts on the highly doped $n^+$-type zone when the component is turned off. The chopping of the reverse current as shown in FIG. 6 occurs in the event of this abutting. The curve E(stat) for the static case is situated considerably higher since the phenomena explained with reference to FIG. 6 do not occur here.

The voltages that can be taken up respectively in the static case and dynamic case correspond to the areas beneath the curves E(stat) and E(dyn), that is to say the field strength $E_{(w)}$ integrated over the width w.

To summarize, it emerges, then, that a component having the doping profile shown in FIG. 7A has a relatively high static blocking capability and a relatively low dynamic blocking capability, the dynamic blocking capability being the voltage at which reverse current chopping occurs.

One possibility for increasing the dynamic blocking capability might consist in making the width of the voltage taking-up region, that is to say the width $w_B$ of the $n^-$-doped region, so large that the electric field does not reach the $nn^+$ junction, that is to say the width $w_B$, at the highest voltage with respect to which the component is commutated. In the case of components having a high blocking capability for an area of use of greater than 2 kV, however, the doping must be chosen to be low enough to achieve a sufficient stability against cosmic radiation. Such a low doping permits the gradient of the electric field to become small, however, and leads to a large extent of the space charge zone. Moreover, a large width of the voltage taking-up region, also called central zone, leads to high on-state and/or switching losses. In this case, said on-state and/or switching losses increase approximately proportionally to the magnitude of $w_B$. Therefore, it is not possible to choose the most suitable values from standpoints of the blocking capability for the width $w_B$.

As is known, there are IGBTs or thyristors which have a more highly n-doped layer as a so-called field stopping area or "buffer" before a p-conducting collector zone or anodal emitter zone. Such a field stopping area can be produced by proton irradiation from the collector or anode side and subsequent annealing (in this respect, cf. "13 kV Rectifiers: Studies on Diodes and Asymetric Thyristors", Proceedings ISPSD 2003, pp. 122-125).

The situation manifested in a component comprising such a field stopping zone is illustrated for the case of a diode in FIG. 7B. As can be gathered from said FIG. 7B, the field stopping zone leads to a higher gradient of the electric field strength E on account of its increased doping. The area beneath the curve E(dyn) thus becomes considerably larger than in the case of a component without a field stopping zone. That is to say that the space charge zone abuts on the $nn^+$ junction only at a higher voltage or—for the case where the field stopping zone is sufficiently highly doped—does not abut at all on the $nn^+$ junction. In the dynamic case, therefore, the semiconductor component configured in this way can block higher voltages.

One disadvantage of a field stopping zone, the depth of which is indicated by $W_{Buf}$ in FIG. 7B, is that the area beneath the curve E(stat) is significantly smaller than in the case of a semiconductor component without a field stopping zone according to FIG. 7A because the zone behind the field stopping zone or between the latter and the highly doped $n^+$-type zone can contribute scarcely or not at all to taking up the electric field.

A semiconductor component in which a curve E(dyn) according to FIG. 7B is applicable in the dynamic case, while the profile of the curve of E(stat) from FIG. 7A is maintained in the static case, would be inherently desirable. This condition is apparently not met by existing semiconductor components.

When a silicon body is irradiated with high-energy electrons or with $H^+$ or $He^{++}$ atomic nuclei (ions), in the silicon a series of different centers Z arise in the area between the valance band V and the conduction band L of silicon, as is illustrated schematically in FIG. 8. Some of these centers are used as recombination centers. Irradiation with $H^+$ ions, that is to say proton irradiation, also gives rise to a center which acts as a fixed donor and can be used for example for producing a field stopping zone, such as for the field stopping zone "Buffer" in FIG. 7B.

Apart from the fixed donor assigned to the proton irradiation, the irradiation with e.g. protons, $He^{++}$ nuclei carbon atoms or electrons and subsequent annealing at a temperature of more than 220° C. give rise specifically to the centers Z shown in FIG. 8, namely double vacancies VV or E (230 K) at −0.24 eV, −0.43 eV and +0.19 eV and a center made up of an association of an oxygen atom with a vacancy, namely a center OV or E (90 K) at an energy level of −0.17 eV, these centers acting as recombination centers.

The so-called K center (COVV), which is described as an association of a carbon atom, an oxygen atom and two vacancies, also arises in all types of irradiation with a subsequent annealing process, that is to say in the event of irradiation with high-energy electrons, with $H^+$ nuclei, $He^{++}$ nuclei or carbon ions. This center is only very weakly effective as a recombination center. It lies at an energy level of +0.355 eV and is also designated by H (195 K).

The K center COVV has been known hitherto primarily owing to its disturbing properties. Thus, DE 187 09 652 A1, for example, reports that a homogeneous distribution arises at K centers after an electron irradiation. These K centers act as a temporary donor: they are positively charged directly after current flow. This charge state lasts a few 100 ns to a few µs depending on the temperature. At this time in which the K centers are effective, the effective basic doping of the semiconductor body doped with them is temporarily raised. On account of such an increased basic doping, a semiconductor component undergoes transition far below its static reverse voltage to an avalanche breakdown. Such a breakdown triggers a high-frequency oscillation, the dynamic IMPATT oscillation. Said IMPATT oscillation disappears after a few microseconds, the semiconductor component generally not being destroyed, however.

It is necessary to avoid an IMPATT oscillation on account of the strong electromagnetic interference emission. For this reason, the permissible number of K centers is limited in the case of the power diode described in DE 197 09 652 A1. This means that electron irradiation can be employed without causing disturbing oscillations.

The publication "Analysis of Dynamic Impatt Oscillations caused by Radiation Induced Deep Centers" Proceedings ISPSD 2003, explains how it is possible to demonstrate the doping effect of K centers by the production of a local profile of defects in the implantation of $He^{++}$ nuclei. The disturbing IMPATT oscillations are likewise used in the process. FIG. 9 shows a profile of the various centers after a helium implantation and annealing in the region of 350° C. It can clearly be seen from FIG. 9 that the COVV centers exceed the OV and VV centers in the concentration K ($cm^{-3}$).

In the above publication, the $He^{++}$ nuclei are implanted from the anode side. Therefore, the distance from the anode is plotted on the abscissa of FIG. 9. However, this publication, too, refers to the disturbing influence of the K centers, which should be avoided as far as possible.

Consequently, the prior art gives the person skilled in the art the clear instruction that the occurrence of K centers should be prevented as far as possible in semiconductor components owing to their disturbing influence.

SUMMARY

It is an object to provide a semiconductor component which is distinguished by a high static reverse voltage but has a field stopping area which in the event of taking up the reverse voltage after a commutation momentarily retards propagation of the space charge zone, delays the abutting thereof on an $nn^+$ (or $pp^+$) junction, maintains the injection of holes into the base zone during the tail phase and thus enables a soft turn-off, so that disturbing oscillations are avoided during turn-off without simultaneous reduction of the static blocking capability.

In the case of a semiconductor component of the type mentioned in the introduction, this object is achieved by virtue of the fact that a temporarily effective area of the first conduction type is provided in the voltage taking-up region before a junction with the more highly doped zone, said area having, between its conduction band and its valence band, centers which can trap free charge carriers in the event of flooding of the voltage taking-up region, but are discharged again in the event of propagation of the space charge zone, so that the area is temporarily effective only in the event of a turn-off operation after flooding with free charge carriers. The temporarily effective area preferably forms a temporary field stopping area before the more highly doped zone.

Preferably, the first conduction type is the n conduction type, and K centers, in particular, are used as centers. Therefore, the temporary field stopping area is only effective in the case of a switching operation if the semiconductor component had previously been flooded with charge carriers. By contrast, the field stopping area has disappeared again in the steady-state case.

In order to enable a field stopping area of this type, at least some embodiments of the present invention advantageously utilizes the K centers that have hitherto been regarded as undesirable. Specifically, said K centers have the character of a donor that is positively charged during the flooding phase. It is discharged again over a certain period of time upon formation of a space charge zone after a commutation, so that a high blocking capability remains ensured in the static case.

Such embodiments therefore exploit an effect—previously described as disadvantageous in the specialist literature—for producing a positive effect, namely for forming a temporary field stopping area.

The semiconductor component according to such embodiments thus uses the properties of the K centers previously described as disturbing as a measure for improving them: specifically, the K centers are arranged in such a way that, as a temporary field stopping area, they delay abutting of the electric field on the highly doped zone in the event of commutation.

As has already been explained above, a substantial obstacle to the use of the K centers for positive properties of semiconductor components is their charging and their discharging, which is effected with a greatly temperature-dependent time constant.

The temperature dependence of the occupancy of the centers, namely the determination of the proportion of the centers which are positively charged, is calculated according to the following equation:

$$N_{TD+} = N_{TD} \frac{e_n + p \cdot c_p}{e_n + e_p + n \cdot c_n + p \cdot c_p} \quad (1)$$

where $n_{TD}$=number of K centers, $n_{TD+}$=number of positively charged K centers, $e_p$=emission rate of positively charged centers, $e_n$=emission rate of negatively charged centers, $c_p$=trapping coefficient of positively charged centers, $c_n$=trapping coefficient of positively charged centers, $c_n$=trapping coefficient of negatively charged centers, p=number of free positive charge carriers and n=number of free negative charge carriers.

In the case of a high injection present in the forward state, n=p can be assumed, where the following respectively holds true:

n=p=1 E 16 cm$^{-3}$.

On account of the temperature dependence of the occupancy, the following is then calculated with the aid of equation (1) for T=300 K: $N_{TD+} \approx 0.92 \, N_{TD}$ T=400 K: $N_{TD+} \approx 0.83 \, N_{TD}$ This means that K centers are positively charged sufficiently even in the range of higher operating temperatures. After the end of the condition of a high injection, that is to say after the charge carrier flooding has ended, the centers are discharged, the time constant $\tau_{ep}$ being determined according to the following equation:

$$\frac{1}{\tau_{ep}} = A_h \cdot T^2 \cdot \exp\left(-\frac{E_T - E_v}{k \cdot T}\right) \quad (2)$$

In this case $A_h$ denotes the arrhenius factor determined with the aid of DLTS measurements (DTLS=Deep Level Transient Capacitance Spectroscopy), $E_T$ denotes the energy level of the K center, $E_V$ denotes the energy level of the upper edge of the valance band, k denotes the Boltzmann constant and T denotes the absolute temperature.

It thus emerges from equation (2) that:

$\tau_{ep}(300 \text{ K}) \approx 6 \, \mu s$ $\tau_{ep}(400 \text{ K}) \approx 0.1 \, \mu s$ The time constant $\tau_{ep}$ is substantially smaller at 400 K than at 300 K and very fast. It is now readily possible, however, to arrange the field stopping layer comprising K centers such that the condition of a high injection is still present in it for a long time during a turn-off operation. For this purpose, it is provided in the zone still flooded by charge carriers in the area of the voltage taking-up and lightly doped region which lies close to the highly doped zone. This is because there the concentration of free charge carriers n or p after a turn-off operation is still in the region of 1 E 16 cm$^{-3}$. This means that the condition of a high injection is manifested there even during the phase of voltage take-up in which the space charge zone propagates.

Preferably, the temporary field stopping area is thus arranged at a depth of 0.75 $W_B$ to 0.95 $W_B$ from the pn junction, $W_B$ denotes the distance between the pn junction and the more highly doped zone of the first conduction type.

The level of the doping concentration in the field stopping area is at least 1 E 14 cm$^{-3}$ and at most 5 E 15 cm$^{-3}$. The upper limit of this doping of the field stopping area is given by the fact that a dynamic IMPATT oscillation is not permitted to commence even at approximately −40° C.

One advantage of the disclosed embodiments is the realization of deep buried, preferably n-doped areas or layers which are only temporarily effective, with the aid of the generation of defects having suitable energy levels in the band gap between the valance band and the conduction band. Such areas or layers with temporarily effective defects, particularly in the case of a diode, lie shortly before preferably an nn$^+$ junction, where they have deep defects with the doping of 1 E 14 cm$^{-3}$ to 5 E 15 cm$^{31\,3}$, preferably 2 E 15 cm$^{-3}$. Said defects have the character of donors which are positively charged during the phase of flooding after the turn-off operation and are discharged again upon formation of a space charge zone. The discharging holes of the field stopping zone and also the charge carriers stored in the area between the field stopping zone and the nn$^+$ junction increase the current flowing through the component during the discharge operation and thus make the turn-off softer; that is to say that current chopping can thus be prevented.

The semiconductor component according to the invention may preferably be a diode, an IGBT (Insulated Gate Bipolar Transistor) or a thyristor. In the case of the two last-mentioned components the temporary field stopping zone may be disposed upstream of a p-type emitter, in which case an additional, steady-state field stopping zone which is situated as closely as possible to the p-type emitter and is produced by means of the customary dopants, such as e.g. phosphorous, may contribute to the further optimization of the electrical properties of these two components.

The semiconductor component according to the invention may also be a power MOS transistor. The latter, and this also holds true for the other components may be embodied using compensation technology, so that a CoolMOS component, by way of example, is present.

As already mentioned, it is readily possible to combine the temporary field stopping zone with other customary field stopping concepts, which is advantageous preferably in the case of an IGBT or an asymmetrical thyristor. If proton irradiation is employed for producing the centers, then a combination of a temporary field stopping area induced by K centers and a steady-state field stopping area induced by the centers produced by means of hydrogen can be realized given a suitable heat treatment and dose by means of an irradiation step.

Instead of the K centers preferably used, it is also possible to employ other centers having comparable properties to the K center. Said centers may be produced e.g. by means of irradiation with high-energy particles, for which helium ions, protons, carbon atoms and electrons, for example, are particularly suitable. In order to realize relative high concentrations of K centers, it is appropriate to provide a carbon concentration that is not excessively low for the basic material of the semiconductor body, or to introduce said carbon concentration directly when using a carbon implantation for producing the K centers.

If the semiconductor component according to the invention is a diode, then the irradiation for producing the centers should preferably be effected from the cathode side, that is to say through an n-conducting emitter. Correspondingly, in the case of an IGBT, the irradiation should be formed from the collector side, that is to say through a p-conducting emitter. It is thereby possible to avoid the formation of the centers over the depth of the voltage taking-up region. In the area through which irradiation is effected, centers are formed only in a relatively low concentration. An excessively high implantation energy can also be avoided in this way, particularly in the case of components having a high blocking capability. If the required implantation dose and implantation energy are not too high, however, then the irradiation may also be carried out from the other side of the component, that is to say from the anode side in the case of a diode and from the emitter side in the case of an IGBT.

Finally, it is also expedient, if appropriate, to perform a multiple implantation with different energies in order thus to form two or more temporary field stopping areas. It is likewise possible to produce a widened temporary field stopping area by means of irradiating the semiconductor body through a metal foil, which has a suitable thickness, with a higher energy in order thus to realize a widened field stopping area for the same penetration depth into the semiconductor body.

Preferably, in the case of the semiconductor component according to the invention, the center produced by irradiation has the character of a donor and is located in an $n^-$-conducting region. However, the invention is not restricted to this. Rather, it may also be applied to a semiconductor component in which such a center forms an acceptor located in a p-conducting region.

BRIEF DESCRIPTION OF THE DRAWINGS

The invention is explained in more detail below with reference to the drawings, in which.

DETAILED DESCRIPTION

FIGS. 6 to 9 have already been explained in the introduction. In the figures, the same reference symbols are used in each case for mutually corresponding structural parts.

Figure 1A:
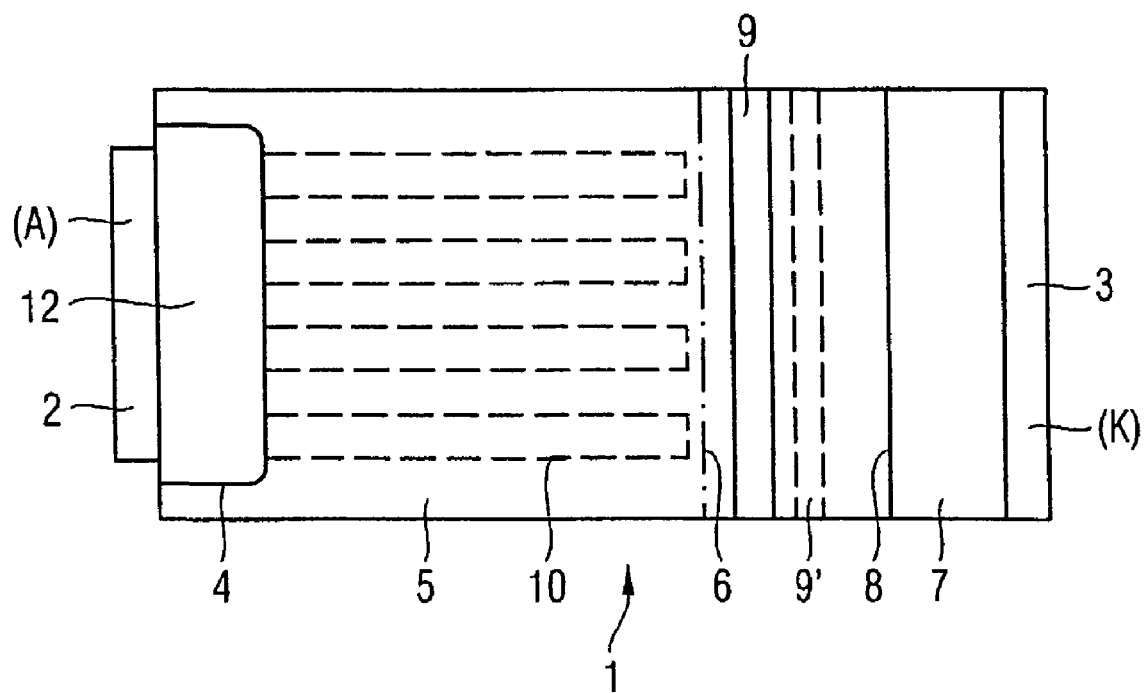
FIG. 1A shows a sectional diagram of a diode as an exemplary embodiment of the semiconductor component according to the invention.

FIG. 1A shows a silicon body 1, which has a carbon concentration that is not too low and which is provided with a first electrode (anode A) 2 and a second electrode (cathode K) 3 on its two main surfaces lying opposite one another. A p-conducting zone (anode zone) 12, a weakly $n^-$-conducting region 5, which forms a pn junction 4 with the zone 12, a highly doped $n^+$-conducting zone 7, which forms an $nn^+$ junction 8 with the region 5, and—according to the invention—a temporary field stopping area 9 are provided in said silicon body 1. If appropriate, a plurality of such field stopping areas 9, 9', . . . may also be employed.

Moreover, FIG. 1A also schematically indicates p-conducting compensation regions 10 which are optionally present and which are located in the region 5 and provide for charge compensation there.

Depending on the reverse voltage present between the electrodes 2, 3, a space charge zone 6 propagates, the boundary of which is indicated schematically in FIG. 1A. The extent of said space charge zone 6 depends on the voltage present between the electrodes 2 and 3.

Figure 1B:
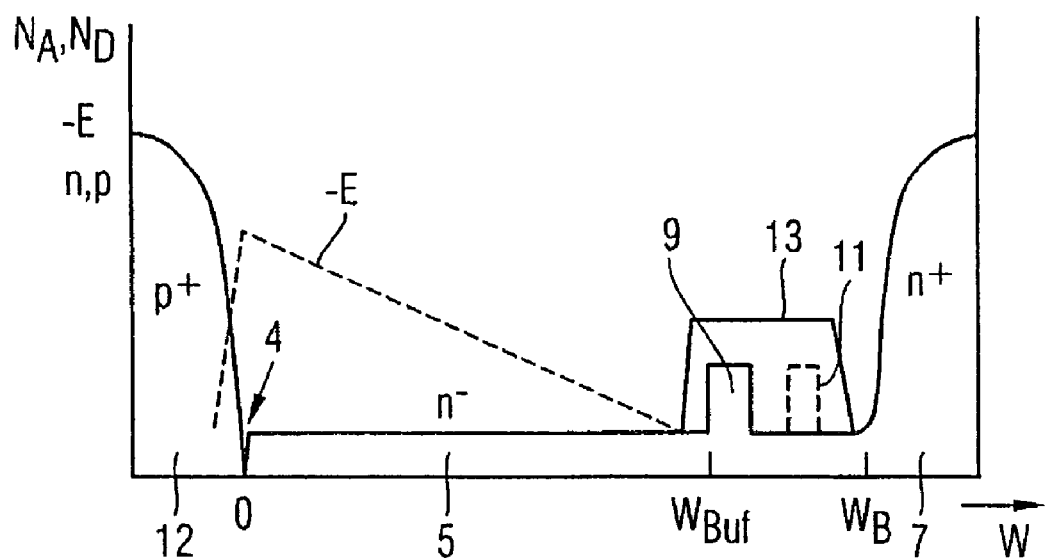
FIG. 1B shows a schematic illustration of the profile of the doping concentration and the electric field in the case of the diode from FIG. 1A.
Figure 7A:
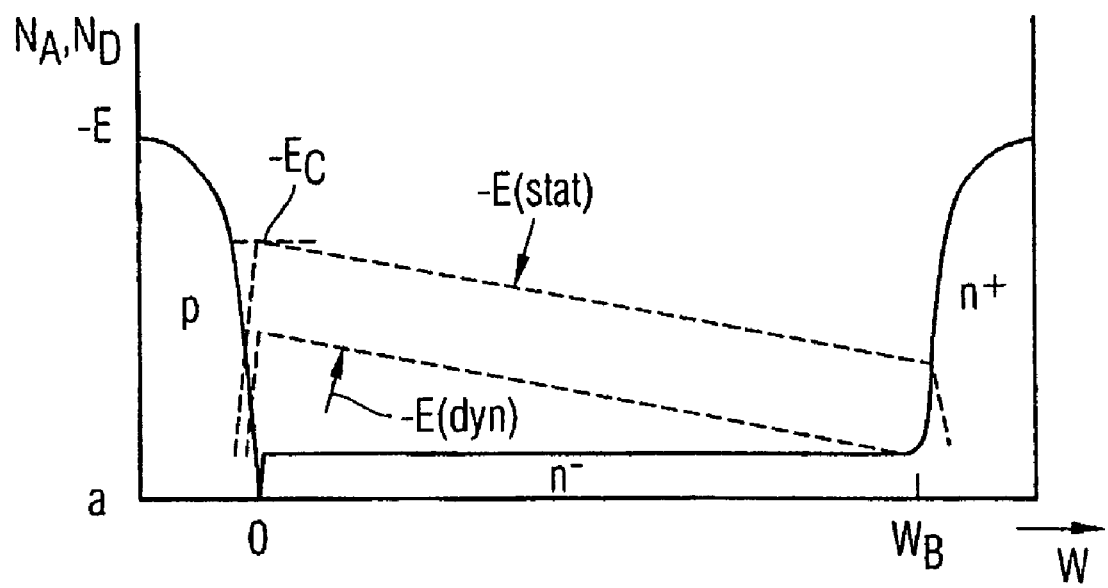
FIG. 7A shows the profile of the doping concentration and of the electric field in the case of a diode without a field stopping area.
Figure 7B:
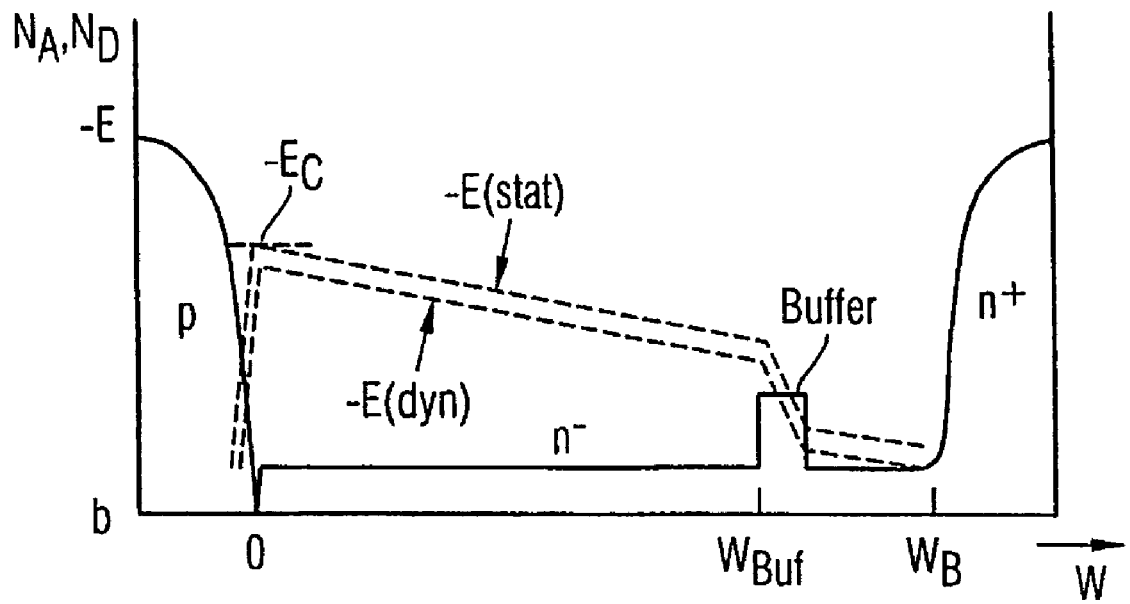
FIG. 7B shows the profile of the doping concentration and of the electric field in the case of a diode with a field stopping area.
Figure 8:
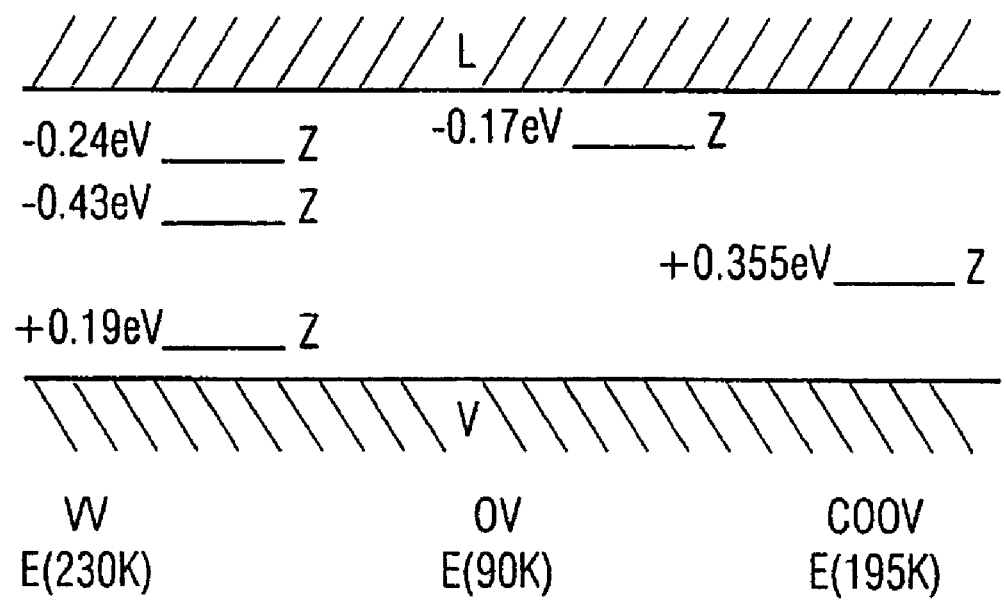
FIG. 8 shows a band diagram with various centers for silicon irradiated with $He^{++}$ nuclei and electrons.
Figure 9:
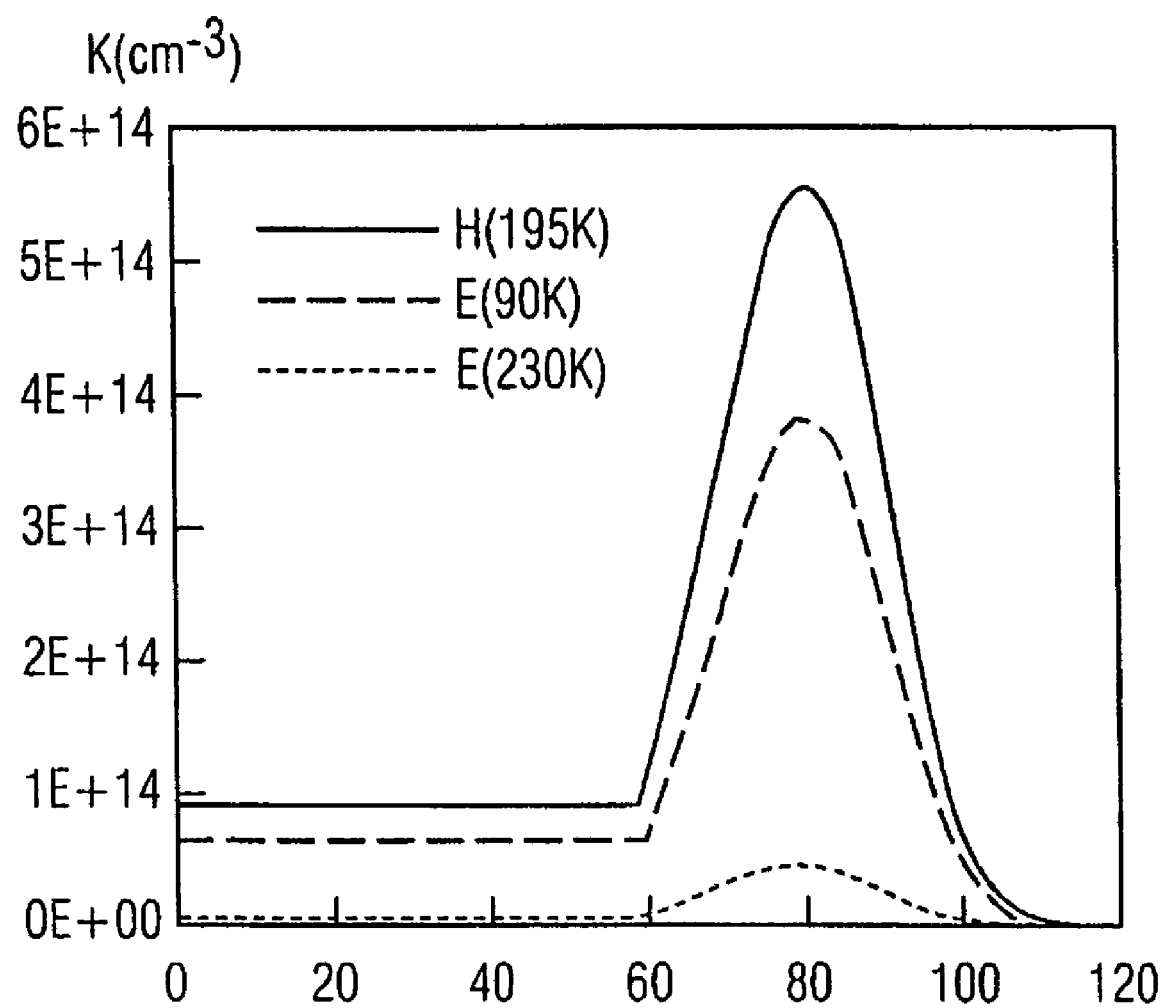
FIG. 9 shows the profile of the concentration profile for various centers after helium implantation and annealing in the region of 350° C.

FIG. 1B shows, similarly to FIGS. 7A and 7B, the profile of the doping concentration and of the electric field for the diode illustrated schematically in FIG. 1A (without compensation regions and without an additional field stopping area 9'). In addition, FIG. 1B also indicates the position of a conventional steady-state field stopping area 11 (the latter is not shown in FIG. 1A).

The temporary field stopping area 9 is preferably situated at 0.75 wB to 0.95 wB, as is indicated in FIGS. 1A and 1B. A charge carrier peak 13 is present in said area when the diode is turned off, thereby ensuring the charge carrier flooding necessary for the formation of the temporary field stopping area 9. The electric field E rises linearly from said charge carrier peak 13 to reach its maximum value at the pn junction 4.

Figure 5:
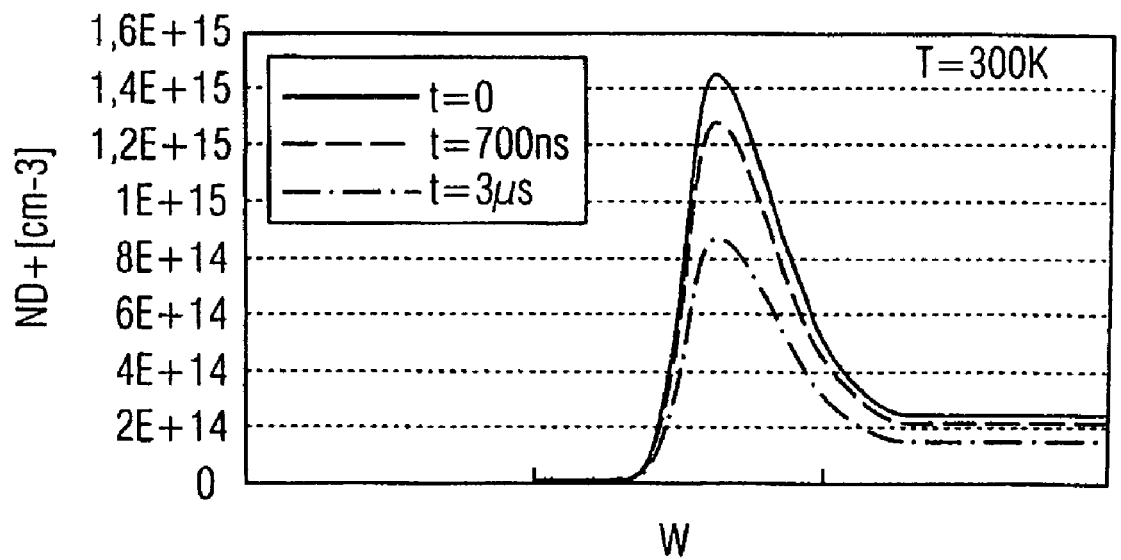
FIG. 5 shows the profile of the discharge of a K center at a temperature of 300 K.

After the space charge zone (cf. dash-dotted line 6 in FIG. 1A) has reached the field stopping zone 9, that is to say shortly after the state illustrated in FIGS. 1A and 1B, the field stopping zone starts to discharge. This process is illustrated in FIG. 5, where the time t=0 is the instant at which the space charge zone 6 starts to penetrate into the field stopping area 9. The charge carrier concentration $N_D^+$ is shown for the instant t=0, t=700 ns and t=3 μs in FIG. 5. It clearly follows from FIG. 5 that after the penetration of the space charge zone 6 into the field stopping area 9, the charge thereof is reduced with a certain time constant, so that said field stopping area actually exhibits a temporary effect.

Figure 2:
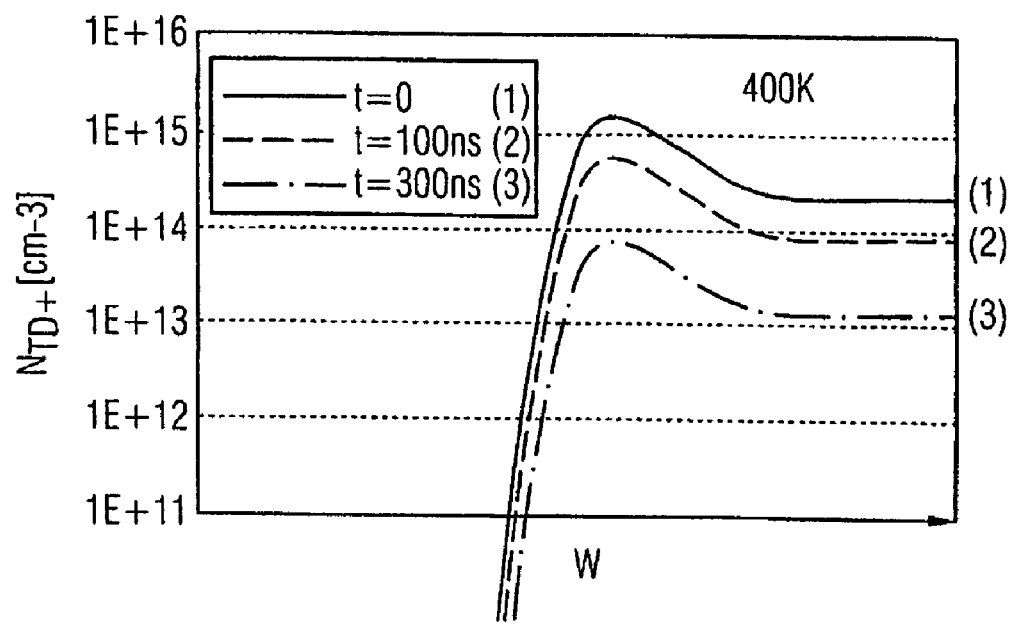
FIG. 2 shows the profile of the discharge of a field stopping zone at a temperature of 400 K.

FIG. 2 shows the profile of the discharge of the field stopping area 9 at a temperature of 400 K. The illustration is given on a logarithmic scale here. It can be seen from this FIG. 2 that after a time t=300 ns, the charge carrier concentration $N_{TD+}$, that is to say the concentration at occupied centers, has decreased by more than one order of magnitude.

Figure 6:
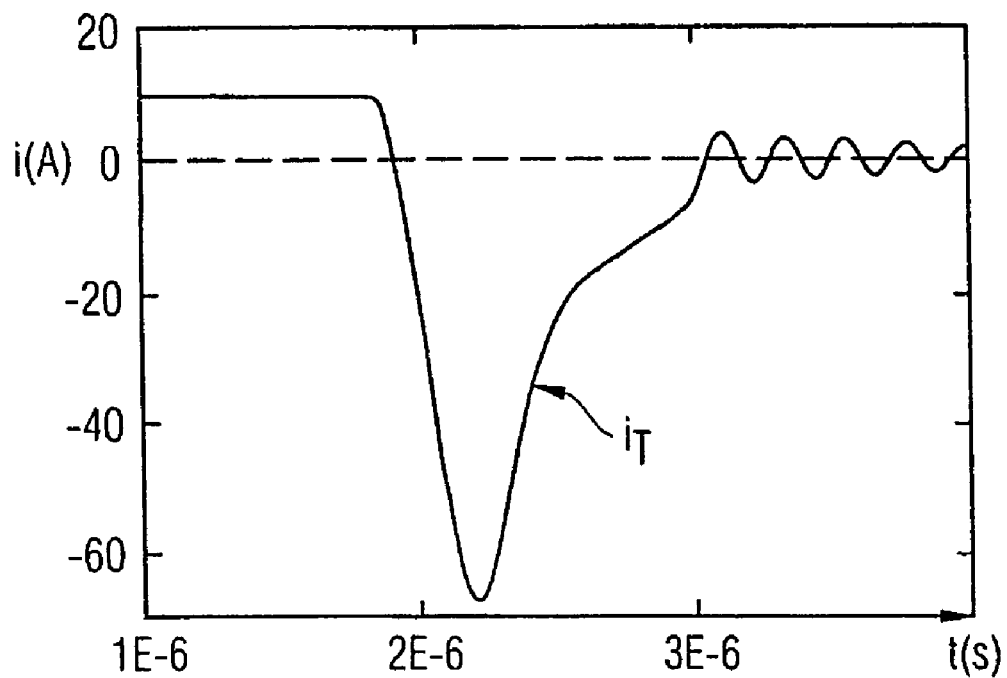
FIG. 6 shows the profile of the tail current in the case of a diode according to the prior art.

For the application of the invention in the case of a semiconductor component, it should be taken into consideration here that the field stopping area 9 is required only for a relatively short time, namely for the period of time of the chopping of the tail current (cf. FIG. 6). The charge carriers flowing during and after the discharge of the field stopping area 9 avoid tail current chopping in that they increase the current through the charge carriers stored between the field stopping area 9 and the n-doped cathode zone in the case of a diode or the p-doped emitter in the case of an IGBT and also through the holes discharged in the temporary field stopping zone itself.

The presence of recombination centers in the field stopping area 9, in particular of the OV center, may be advantageous in specific components. This is the case particularly with IGBTs having a field stopping area. In the case of fast diodes, the arrangement of such recombination centers at this location is generally not expedient, however. It is possible, however, to alter the composition of the centers through suitable heat treatment.

Figure 3:
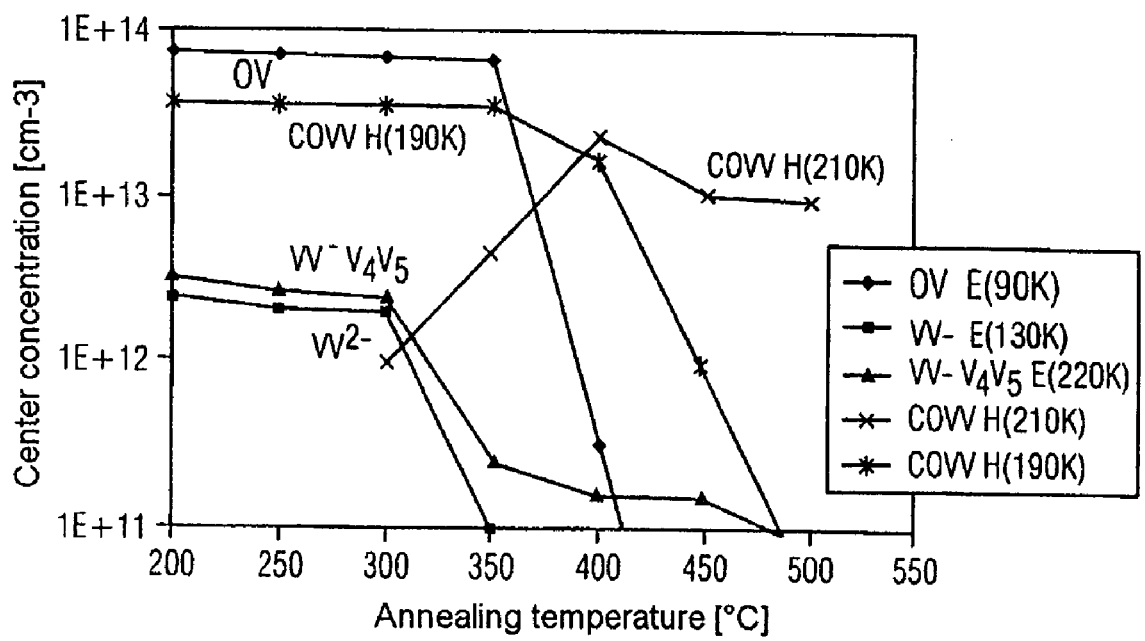
FIG. 3 shows the dependence of the concentration of various centers on the annealing temperature.

FIG. 3 shows an example of this. FIG. 3 has been compiled according to data from W. Wondrak, dissertation, Frankfurt, 1985. The signals H(190K) and H(210K) are distinguished here, however both are assigned to the K center. FIG. 3 shows that the K center COVV is highly stable with respect to heat treatment, while the strong recombination center OV disappears at temperatures of >400° C. Consequently, at >420° C. there is a window in which the K center prevails and the effect of the radiation-induced centers as recombination centers is largely eliminated. This range is preferably chosen for the setting of the switching behavior of a diode.

Figure 4:
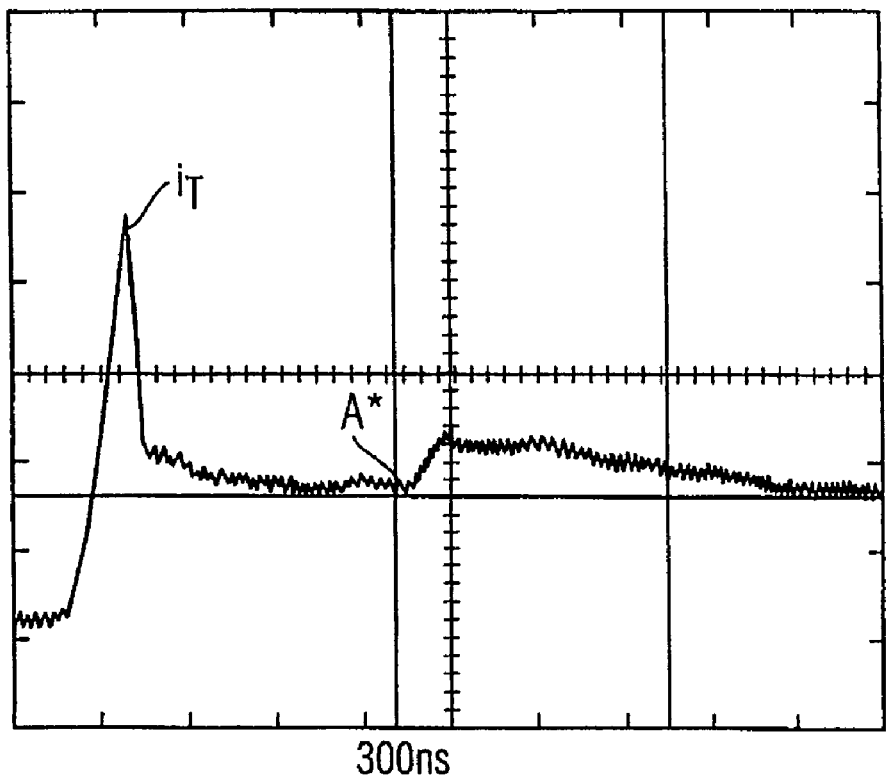
FIG. 4 shows the measured recovery behavior of a diode having K centers.

FIG. 4 illustrates the measured recovery behavior of a diode having K centers in the field stopping area 9, that is to say in the back part of the lightly doped region 5. Said K centers are produced by an He$^{++}$ implantation here. After approximately 300 ns, the tail current $I_T$ (cf. the location "A*") exhibits an additional current rise. The electric field reaches the temporary field stopping zone 9 at this instant. If FIG. 4 is compared with FIG. 6, it can be illustrated that precisely the current which is absent at the end of the tail current $I_T$ in the conventional semiconductor component in accordance with FIG. 6 can be obtained from the field stopping area 9 and the zone that is situated between the more highly doped zone 7 and the zone 9 and is flooded with free charge carriers until the instant at which the zone 9 is discharged.

The semiconductor component according to the invention is explained on the basis of a vertical structure. However, it may readily have a lateral structure as well.

LIST OF REFERENCE SYMBOLS

1 Semiconductor body
2 First electrode
3 Second electrode
4 pn junction
5 Weakly doped region
6 Space charge zone
7 Heavily doped zone
8 nn$^+$ junction
9, 9' Temporarily effective region
10 Compensation region
11 Region effective in steady-state
12 Anode zone
13 Charge carrier peak
A Anode
K Cathode
$i_T$ Tail current
E(stat) Static electric field
E(dyn) Dynamic electric field
$N_A$ Acceptor concentration
$N_D$ Donor concentration
w Width of the weakly doped region

The invention claimed is:

1. A semiconductor component comprising:
   at least two electrodes; and
   a semiconductor body coupled to the at least two electrodes, the semiconductor body including at least one pn junction and a voltage taking-up region of a first conduction type in which a space charge zone propagates if a voltage that reverse-biases the pn junction is applied to the electrodes,
   wherein the voltage taking-up region further includes a temporarily effective area of the first conduction type having, between a conduction band and a valence band, centers configured to trap free charge carriers in the event of flooding of the voltage taking-up region, and to discharge the charge carriers in the event of propagation of the space charge zone, such that the area is temporarily effective corresponding to the event of a turn-off operation after flooding with free charge carriers, wherein the temporarily effective area is arranged at a depth of substantially between 0.75 $W_B$ to 0.95 $W_B$ from the pn junction, where $W_B$ denotes the distance between the pn junction and an opposite edge of the voltage taking-up region.

2. The semiconductor component as claimed in claim 1, further comprising a zone doped more highly than the voltage taking-up region disposed between said voltage taking-up region and a first of the two electrodes, and wherein the temporarily effective area is arranged in the voltage taking-up region.

3. The semiconductor component as claimed in claim 2, wherein the more highly doped zone has the first conduction type.

4. The semiconductor component as claimed in claim 1, wherein the more highly doped zone has a second conduction type opposite to the first conduction type.

5. The semiconductor component as claimed in claim 1, wherein the first conduction type is the n conduction type.

6. The semiconductor component as claimed in one of claims 1, wherein the centers comprise K centers.

7. The semiconductor component as claimed in claim 6, wherein the K centers comprise the association of a carbon atom, an oxygen atom and two vacancies (COVV).

8. The semiconductor component as claimed in claim 6, wherein the K centers are produced by irradiation with high-energy particles.

9. The semiconductor component as claimed in claim 8, wherein the K centers have a relative concentration corresponding to being produced by annealing at a temperature of more than 300° C. subsequent to the irradiation.

10. The semiconductor component as claimed in claim 8, wherein the high-energy particles comprise protons or helium nuclei.

11. The semiconductor component as claimed in claim 8, wherein the high-energy particles comprise carbon atoms which form K centers and contribute to the material of the semiconductor body.

12. The semiconductor component as claimed in claim 1, wherein the temporarily effective area comprises a field stopping area.

13. The semiconductor component as claimed in claim 1, wherein the temporarily effective area has a doping concentration of substantially between 1 E 14 cm$^{-3}$ and 5 E 15 cm$^{-3}$.

14. The semiconductor component as claimed in claim 13, wherein the doping concentration is substantially between 1 E 14 cm$^{-3}$ and 2 E 15 cm$^{-3}$.

15. The semiconductor component as claimed in claim 1, wherein the pn junction forms a part of one of a group consisting of a diode, IGBT, thyristor or MOSFET.

16. The semiconductor component as claimed in claim 15, wherein the voltage taking-up region further includes compensation regions of a second conduction type.

17. The semiconductor component as claimed in claim 1, further comprising a steady-state field stopping area.

18. The semiconductor component as claimed in claim 1, further comprising at least one further temporarily effective area in addition to the temporarily effective area.

19. The semiconductor component as claimed in claim 18, wherein the temporarily effective area and the at least one further tempoerarily effective area are produced by multiple implantations.

20. The semiconductor component as claimed in claims 1, wherein the semiconductor body is structured vertically.

21. The semiconductor component as claimed in 1, wherein the semiconductor body is structured laterally.

22. A method for production of the semiconductor component comprising at least two electrodes and a semiconductor body coupled to the at least two electrodes and a semiconductor body coupled to the at least two electrodes, the semiconductor body including at least one pn junction and a voltage taking-up region of a first conduction type in which a space charge zone propagates if a voltage that reverse-biases the pn junction is applied to the electrodes, wherein the voltage taking-up region further includes a temporarily effective area of the first conduction type having, between a conduction band and a valence band, centers configured to trap free charge carriers in the event of flooding of the voltage taking-up region, and to discharge the charge carriers in the event of propagation of the space charge zone, such that the area is temporarily effective corresponding to the event of a turn-off operation after flooding with free charge carriers, wherein the temporarily effective area is arranged at a depth of substantially between $0.75 \, W_B$ to $0.95 \, W_B$ from the pn junction, where $W_B$ denotes the distance between the pn junction and an opposite edge of the voltage taking-up region, the method comprising:

introducing K centers by implantation of high-energy particles into a weakly doped region of the semiconductor body.

23. The method as claimed in claim 22, further comprising performing annealing at a temperature of more than 300° C. subsequent to the irradiation.

24. The method as claimed in claim 22, wherein the high-energy particles comprise protons or helium nuclei.

25. The method as claimed in claim 22, wherein the high-energy particles comprise carbon atoms.

26. The method as claimed in claim 23, wherein the annealing is performed at a temperature of more than 420° C.

27. The method as claimed in claim 22, further comprising performing a multiple implantation to produce the temporarily effective area.

28. The method as claimed in claim 22, further comprising performing the implantation through a metal foil.

29. The method as claimed in claim 22, further comprising performing an implantation with protons to produce a steady-state field stopping area.

30. The method as claimed in claim 22, wherein the implantation is performed from a side opposite a side closest to the pn junction.

31. A semiconductor component comprising:

at least two electrodes; and a semiconductor body coupled to the at least two electrodes, the semiconductor body including at least one pn junction and a voltage taking-up region of a first conduction type in which a space charge zone propagates if a voltage that reverse-biases the pn junction is applied to the electrodes, wherein the voltage taking-up region further includes a temporarily effective area of the first conduction type having, between a conduction band and a valence band, centers configured to trap free charge carriers in the event of flooding of the voltage taking-up region, and to discharge the charge carriers in the event of propagation of the space charge zone, wherein the temporarily effective area is arranged at a depth of substantially between $0.75 \, W_B$ to $0.95 \, W_B$ from the pn junction, where $W_B$ denotes the distance between the pn junction and an opposite edge of the voltage taking-up region.

* * * * *